(12) United States Patent
Bertilson et al.

(10) Patent No.: US 10,943,764 B2
(45) Date of Patent: Mar. 9, 2021

(54) APPARATUS FOR WAVELENGTH RESOLVED ANGULAR RESOLVED CATHODOLUMINESCENCE

(71) Applicant: Gatan, Inc., Pleasanton, CA (US)

(72) Inventors: Michael Bertilson, Dublin, CA (US); John Andrew Hunt, Fremont, CA (US); David J. Stowe, Newbury (GB)

(73) Assignee: Gatan, Inc., Pleasanton, CA (US)

( * ) Notice: Subject to any disclaimer, the term of this patent is extended or adjusted under 35 U.S.C. 154(b) by 0 days.

(21) Appl. No.: 16/426,629

(22) Filed: May 30, 2019

(65) Prior Publication Data

US 2019/0371569 A1  Dec. 5, 2019

Related U.S. Application Data

(60) Provisional application No. 62/677,871, filed on May 30, 2018.

(51) Int. Cl.
  *H01J 37/22* (2006.01)
  *H01J 37/244* (2006.01)
  *H01J 37/28* (2006.01)

(52) U.S. Cl.
  CPC .......... *H01J 37/228* (2013.01); *H01J 37/244* (2013.01); *H01J 37/28* (2013.01); *H01J 2237/2808* (2013.01)

(58) Field of Classification Search
  CPC ........ H01J 37/00; H01J 37/224; H01J 37/228; H01J 37/26; H01J 37/261
  USPC .......................................... 250/306, 307, 311
  See application file for complete search history.

(56) References Cited

U.S. PATENT DOCUMENTS

| 7,589,322 | B2* | 9/2009 | Nishikata | H01J 37/228 250/306 |
| 2006/0158721 | A1 | 7/2006 | Nakata et al. | |
| 2010/0220316 | A1 | 9/2010 | Finarov | |
| 2011/0220793 | A1* | 9/2011 | Thomas | H01J 37/20 250/307 |

OTHER PUBLICATIONS

Mignuzzi et al., Energy-Momentum Cathodoluminescence Spectroscopy of Dielectric Nanostructures, 2018, ACS, Photonics, 5, pp. 1381-1387. (Year: 2018).*
Sandro Mignuzzi et al. "Energy-Momentum Cathodoluminescence Spectroscopy of Dielectric Nanostructures." ACS Photonics, vol. 5, Jan. 2018, pp. 1381-1387.
Joshua D. Caldwell et al. "Luminescence Imaging of Extended Defects in SiC via Hyperspectral Imaging." Materials Science Forum vols. 717-720, 2012, pp. 403-406.
PCT International Search Report and Written Opinion issued for the corresponding international application No. PCT/US2019/034350, dated Aug. 29, 2019, 7 pages.

* cited by examiner

*Primary Examiner* — Jason L McCormack
(74) *Attorney, Agent, or Firm* — Snyder, Clark, Lesch & Chung, LLP

(57) ABSTRACT

Apparatuses for collection of wavelength resolved and angular resolved cathodoluminescence (WRARCL) emitted from a sample exposed to an electron beam (e-beam) or other excitation beams are described. Cathodoluminescence light (CL) may be emitted from a sample at specific angles relative to the excitation beam and analyzed with respect to light-emitting and other optical phenomena. The described embodiments allow collection of WRARCL data more efficiently and with significantly fewer aberrations than existing systems.

6 Claims, 13 Drawing Sheets ns with ion beam, or photon beam, transfers energy to a sample. The emitted CL light photons 34 may have a wavelength and angle with respect to the excitation

APPARATUS FOR WAVELENGTH RESOLVED ANGULAR RESOLVED CATHODOLUMINESCENCE

CROSS-REFERENCE TO RELATED APPLICATION

This application claims priority under 35 U.S.C. § 119, based on U.S. Provisional Application No. 62/677,871, filed May 30, 2018, the disclosure of which is hereby incorporated by reference herein.

BACKGROUND

When a high-energy charged particle such as an electron or ion beam strikes a sample, photons can be emitted depending on the sample material. This phenomenon is emitted known as cathodoluminescence (CL). The collection and detection of these photons in the wavelength range from ultraviolet (UV) through visible to infrared (IR), can provide a wealth of information about the sample under investigation. CL is typically examined with the sample in an electron microscope and by directing the CL-emitted photons to, for example a light sensor, image array or spectroscopy equipment, any or all of which may be located outside the electron microscope beam column. The inside of the electron microscope beam column is kept at low pressures so the electrons can travel to the sample without significant scattering by gas in the electron beam column. After the light is collected, it can be transmitted from the low-pressure environment, through an optical window, and into instruments that analyze the CL light.

A common way to collect photons emitted via CL is via a collection-mirror, which may be a paraboloid mirror, located on axis with the electron beam (e-beam) and either above (more typically) or below the sample or both above and below the sample. In instances where the collection-mirror is located above the sample, on axis with the e-beam, the mirror will have a hole to allow the e-beam to pass through the mirror to the sample unobstructed.

The CL signal contains much information about the sample from which it is emitted. Analysis of the CL signal may make use of the total CL intensity, spectral information, polarization information, and angular resolved light emission. CL light may be emitted by a sample at many angles with respect to the sample surface. The angle at which CL light is emitted and the intensity and spectrographic content of the light at various emission angles can be useful information in characterizing and analyzing a sample under inspection.

DETAILED DESCRIPTION OF PREFERRED EMBODIMENTS

Those skilled in the art will recognize other detailed designs and methods that can be developed employing the teachings of the present invention. The examples provided here are illustrative and do not limit the scope of the invention, which is defined by the attached claims. The following detailed description refers to the accompanying drawings. The same reference numbers in different drawings may identify the same or similar elements.

Figure 1:
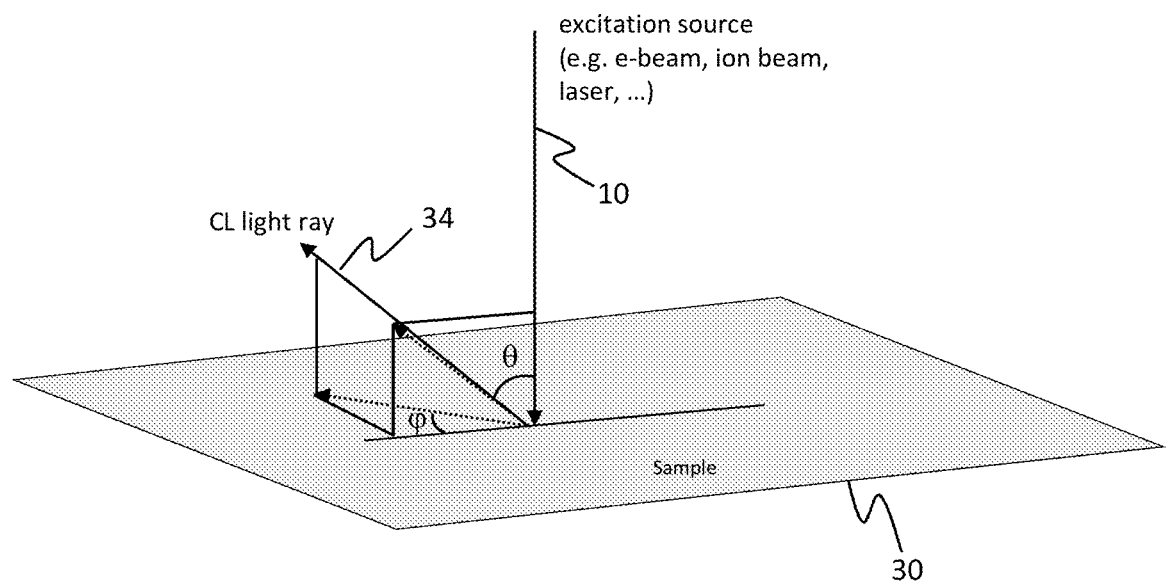
FIG. 1 is a diagram showing the emission of cathodoluminescence light in a sample resulting from an excitation source.

As shown in FIG. 1, CL light may be emitted from a sample 30 when an excitation beam source, such as an electron beam 10, ion beam, or photon beam, transfers energy to a sample. The emitted CL light photons 34 may have a wavelength and angle with respect to the excitation source beam, θ,φ which is characteristic of elemental, chemical, or dielectric properties of the analyzed region of the sample 10. Substantial information on these properties can be obtained by analysis of emitted photon intensity (I) distributions of wavelength I(λ), angle I(θ,φ) or wavelength-angle I(θ,φ,λ). Further information can be obtained by studying the optical polarization of these distributions.

One practical example of how this information may be useful is in the study of light-emitting diodes where the intensity-distribution I(θ,φ) affects the range of angles where the emitted light can be seen. Furthermore, the wavelength of light (λ) leaving the light-emitting diode may change as a function of angle, so it is useful to study or analyze I(θ,φ,λ).

Figure 2:
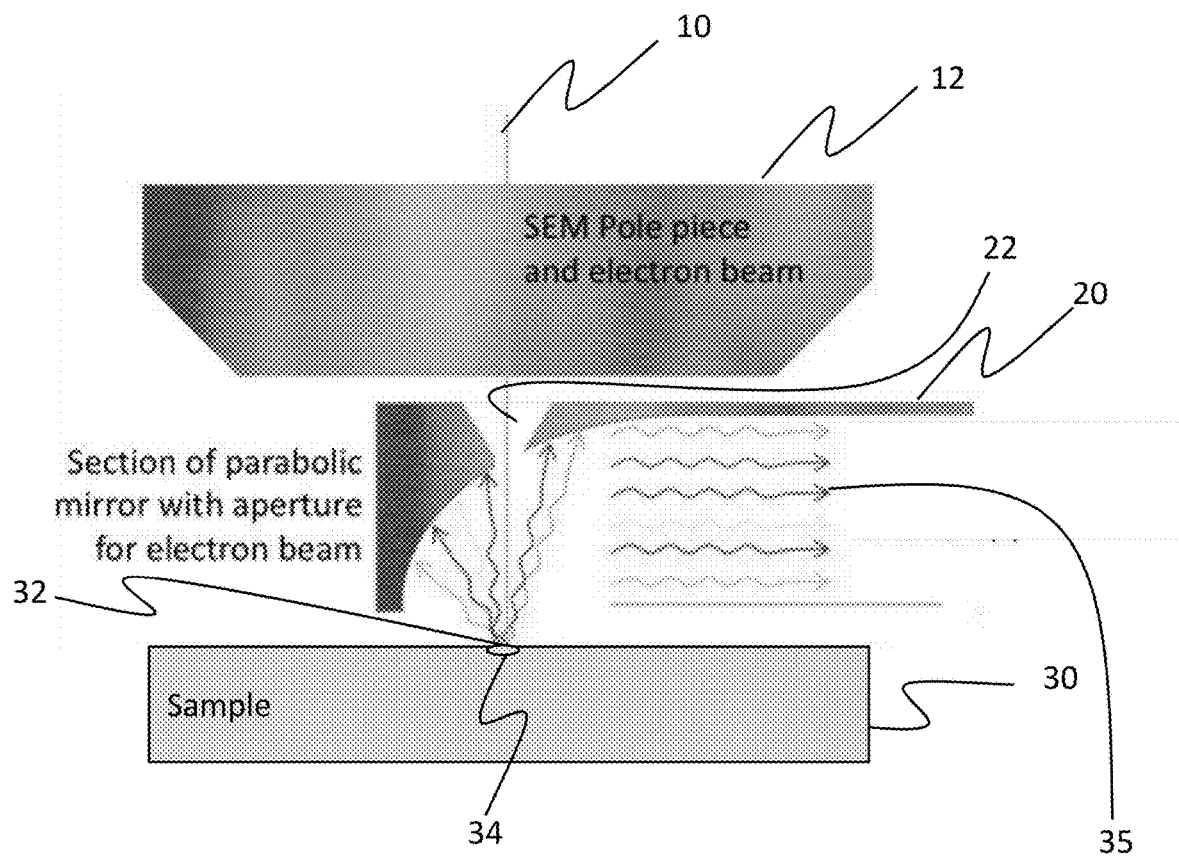
FIG. 2 is a diagram of an apparatus for collection of cathodoluminescence light in an electron microscope.

In a typical CL instrument, as shown in FIG. 2, there is an electron microscope such as a scanning electron microscope (not shown) that produces an electron beam (e-beam) 10 that exits a pole piece 12 and is directed to sample 30. At the point 32 where the e-beam 10 strikes the sample 30, cathodoluminescence (CL) light 34 may be generated. A collection-mirror, 20, which may be a paraboloid mirror, is provided to reflect the CL light 34 to detectors (not shown), which may be located outside of the electron microscope. The collection-mirror 20 will typically have an aperture 22 to allow the e-beam 10 to pass through, since the mirror may be made of a material (e.g. diamond polished aluminum) that would otherwise obstruct the e-beam CL light 34 collected by CL mirror 20, when properly focused on the sample 30, produces a light-pattern 35 that is collimated along the exit optic axis (not labeled) of mirror 20. In a typical CL instrument, the light collected by collection-mirror 20 is sent to one or more CL analysis instruments.

Figure 3:
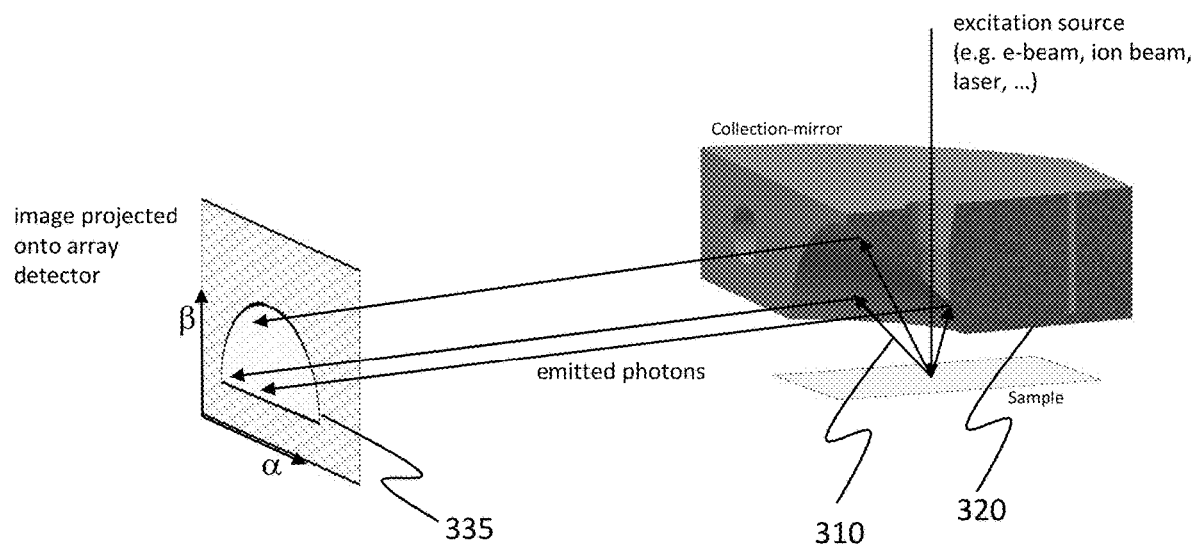
FIG. 3 is an isometric drawing showing the emission of CL reflecting off a collection-mirror and passing through a plane αβ and onto an imaging detector.

FIG. 3 is an isometric drawing showing the emission of CL 310 reflecting off a collection-mirror 320, producing light-pattern 335 which propagates to a two-dimensional (2D)-array imaging detector. Light pattern 335 has an intensity-distribution I(α,β) which differs from intensity-distribution I(θ,φ). The two distributions, however, are mathematically related and either one can be calculated from the other. Typically, an imaging detector records intensity-distribution I(α,β) and a geometric algorithm related to the shape of the collection mirror 320 is used to calculate intensity-distribution I(θ,φ). Both I(θ,φ) and I(α,β) are referred to as angle-resolved CL (ARCL) patterns. The light-pattern 335 has an axis of symmetry that is parallel to β in FIG. 3 and herein is referred to as the symmetric axis. The axis which is perpendicular to the symmetric axis, parallel to a in FIG. 3, is herein referred to as the asymmetric axis.

Figure 4:
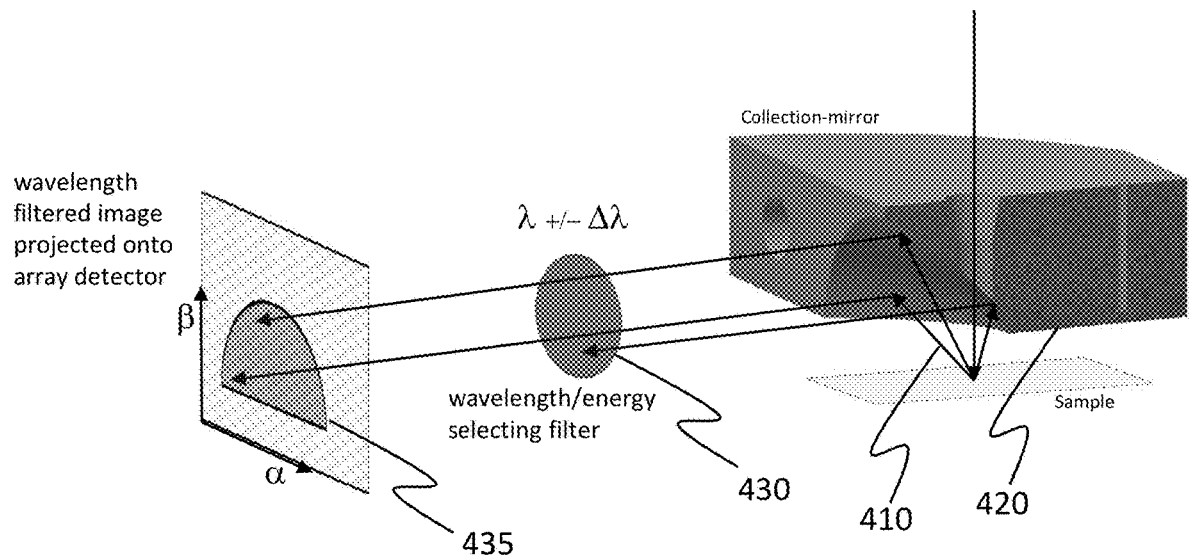
FIG. 4 is an isometric drawing showing the emission of CL reflecting off a collection-mirror, then wavelength-filtered by optical filters before passing through a plane αβ and onto an imaging detector.

FIG. 4 is an isometric drawing showing the emission of CL 410 reflecting off a collection-mirror 420, producing a light-pattern which propagates to an optical filter assembly 430 which typically wavelength-filters all but a narrow range of wavelengths $\Delta\lambda_f$ centered around wavelength $\lambda_f$. The light entering optical filter assembly 430 has intensity-distribution $I_0(\alpha,\beta,\lambda)$ and exits with $I_1(\alpha,\beta,\lambda=\lambda_f)$. Typically, an imaging detector (not shown) records $I_1(\alpha,\beta,\lambda=\lambda_f)$ as ARCL pattern $I_1(\alpha,\beta)$ 435, and a geometric algorithm related to the shape of the collection mirror 420 is used to calculate intensity-distribution $I_1(\theta,\phi)$ for wavelengths $\lambda_f+/-\Delta\lambda_f$. This may be repeated for several filters to build up information about $I_1(\theta,\phi,\lambda)$, but the resolution in wavelength λ is in practice limited by the inconvenience and expense of manipulating a large number of filters.

Figure 5:
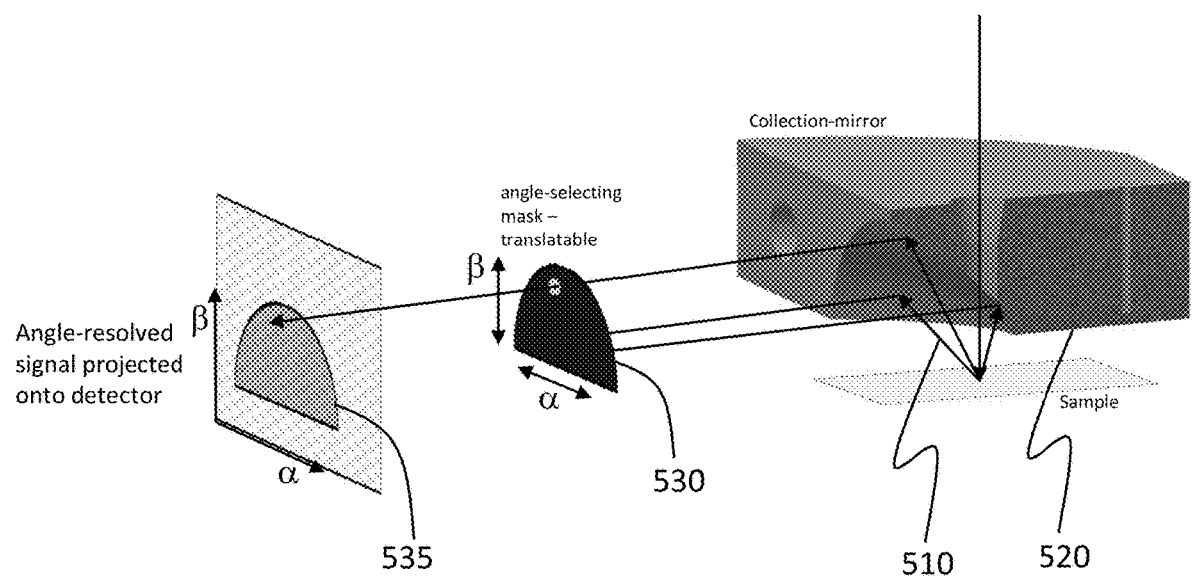
FIG. 5 is an isometric drawing showing the emission of CL reflecting off a collection-mirror, then angle-resolved by a pinhole before passing through a plane αβ and onto a detector.

FIG. 5 is an isometric drawing showing the emission of CL 510 reflecting off a collection-mirror 520, producing a light-pattern that propagates to a pinhole filter assembly 530 which filters all but a narrow range of angles in α and β. The light intensity can be detected with a single-channel detector (not shown). The ARCL pattern I(α,β) 535 can be measured by scanning the pinhole over ranges of α and β. An optical filter assembly, not shown but similar to that shown in FIG. 4, can be used to limit the wavelengths measured to $\lambda_f+/-\Delta\lambda_f$.

Figure 6:
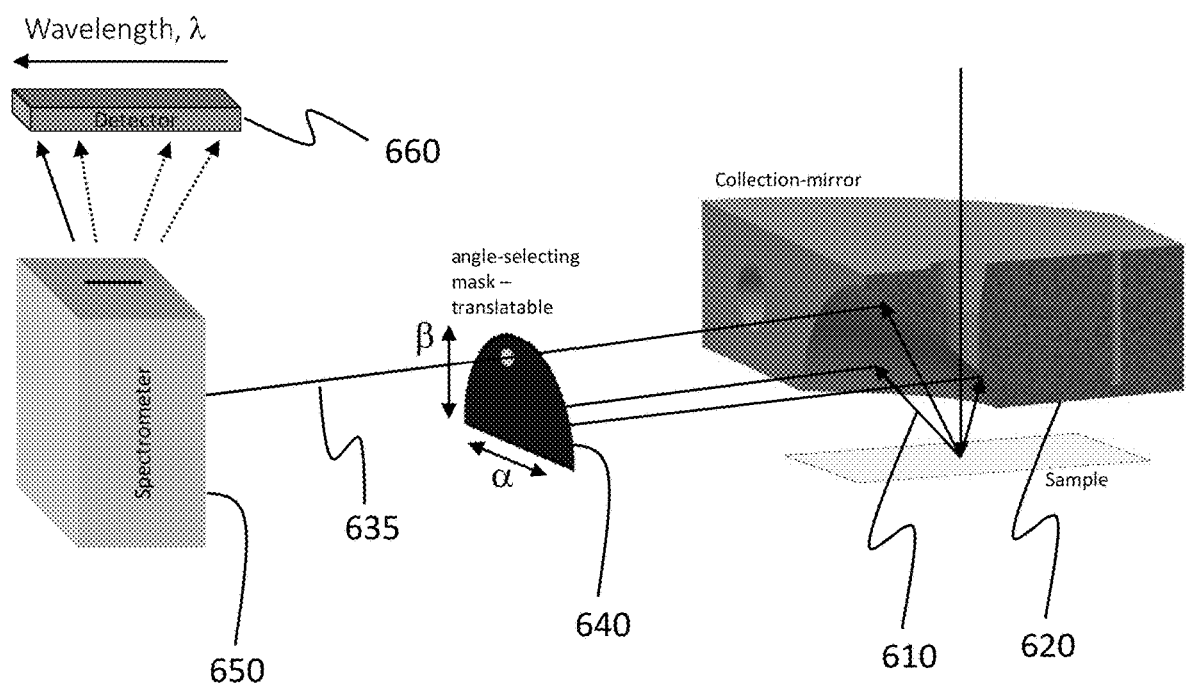
FIG. 6 is an isometric drawing showing the emission of CL reflecting off a collection-mirror, then angle-resolved by a pinhole before passing through a spectrometer that disperses the signal into a wavelength-spectrum and onto a 1D or 2D imaging detector.

FIG. 6 is an isometric drawing showing the emission of CL 610 reflecting off a collection-mirror 620, producing a light-pattern that propagates to a pinhole filter assembly 640, which filters all but a narrow range of angles in α and β. The remaining light intensity 635 is then coupled into an optical spectrometer 650 that disperses the light intensity I as a function of wavelength λ. The dispersed light is then recorded on a detector 660 as I(λ). The wavelength-resolved ARCL pattern (WRARCL) I(α,β,λ) can be measured by scanning the pinhole 640 over ranges of α and β.

Figure 7:
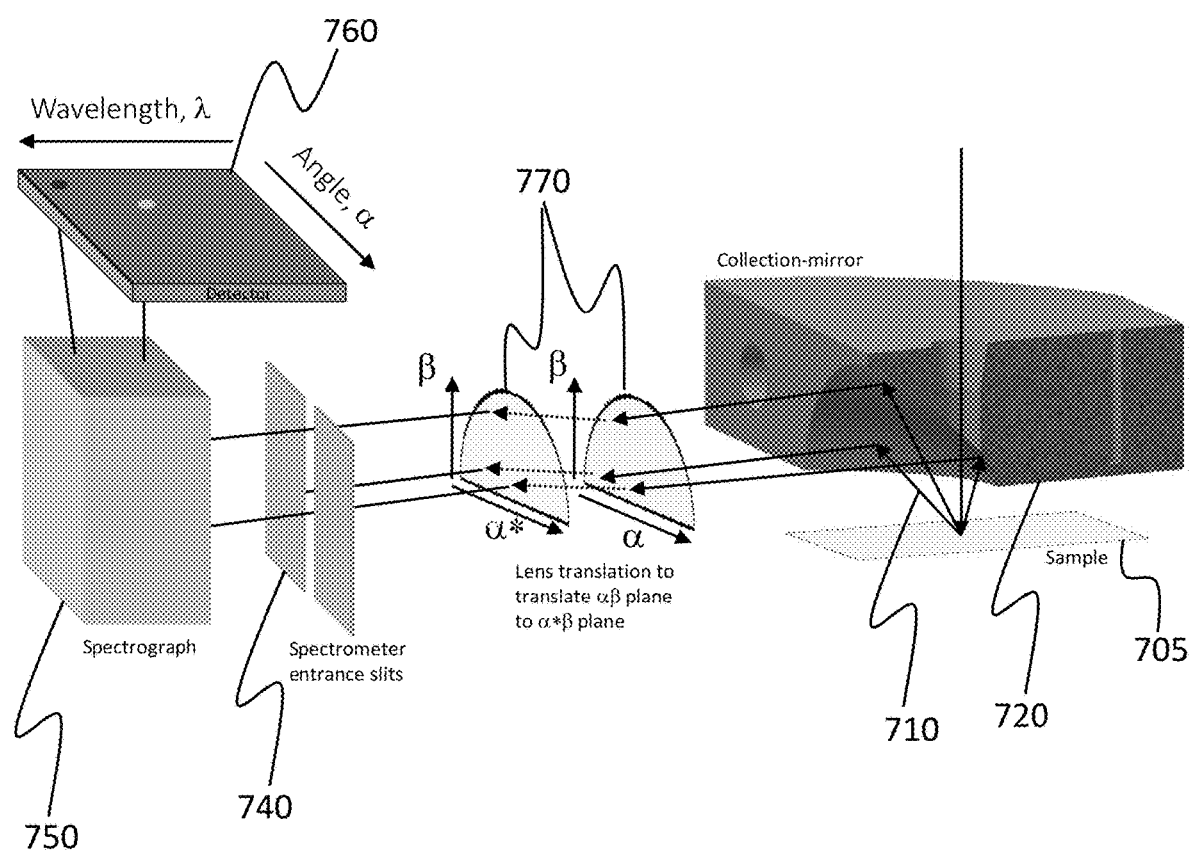
FIG. 7 is an isometric drawing showing the emission of CL reflecting off a collection-mirror, then angle-resolved by an α-selecting slit before passing through a spectrograph that disperses the signal into a wavelength-angle image and onto a 2D imaging detector.

FIG. 7 is an isometric drawing showing the emission of CL 710 reflecting off a collection-mirror 720, producing a light-pattern which may be translated by lens translation system 770 and then propagates to a slit assembly 740 which filters all but a narrow range of angles with respect to α. The remaining light intensity is then coupled into an optical spectrograph 750 that disperses the light intensity I as a function of wavelength λ versus angle β. The dispersed light is then recorded on a 2D detector 760 as I(β,λ). Recording the I(β,λ) in this way is significantly faster and more dose efficient (i.e. more light is collected per high energy exposure to the sample) than the method and apparatus shown in FIG. 6. A lens translation system 770 may also be used for translating the light intensity over the slit 740 in the α direction for the purpose of obtaining the WRARCL pattern I(α,β,λ). However this would introduce significant angular aberration. Another method of selecting different values of a to record I(β,λ) is to scan the slit 740 in the α direction, but this will introduce significant wavelength aberrations. Yet another method to select different values of α to record I(β,λ) is to rotate the sample 705 perpendicular to the excitation beam, but this requires error-prone and time-consuming movement of the sample with nanometer precision.

Figure 8:
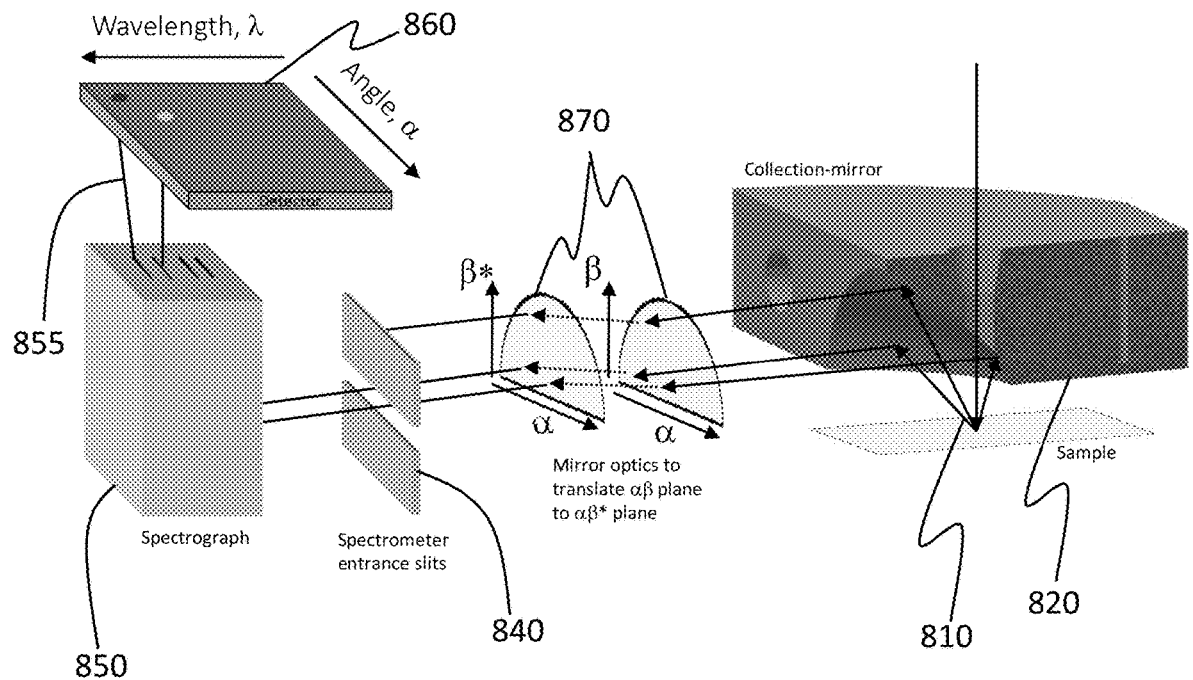
FIG. 8 is an isometric drawing showing the emission of CL reflecting off a collection-mirror, then angle-resolved by a β-selecting slit before passing through a spectrograph that disperses the signal into a wavelength-angle image and onto a 2D imaging detector.

An embodiment of an aspect of the current invention is shown in, FIG. 8, which is an isometric drawing showing the emission of CL reflecting off a collection-mirror 820, producing light-pattern which may be translated by lens translation system 870 and then propagates to a slit assembly 840, which filters all but a narrow range of angles in β. The remaining light intensity is then coupled into an optical spectrograph 850 that disperses the light intensity I 855 as a function of wavelength λ versus angle α. The dispersed light is then recorded on a 2D detector 860 as I(α,λ). A mirror translation apparatus 870 may be used to translate the light intensity over the slit 840 in the β direction for the purpose of obtaining the WRARCL pattern I(α,β,λ). Use of a mirror translation apparatus 870 for scanning has the advantage of not introducing spectroscopy aberration, angular aberrations, or the need for rotating the specimen. An advantage of translating in the β direction, instead of the α direction as in FIG. 7, is that the angular space to be scanned is half as large and can be scanned in half of the time. An exemplary mirror translation apparatus is described in related U.S. Provisional Patent Application No. 62/671,152 titled Cathodoluminescence Optical Hub filed on May 14, 2018. The entire disclosure of Application No. 62/671,151 is incorporated in the present application by reference.

Figure 9A:
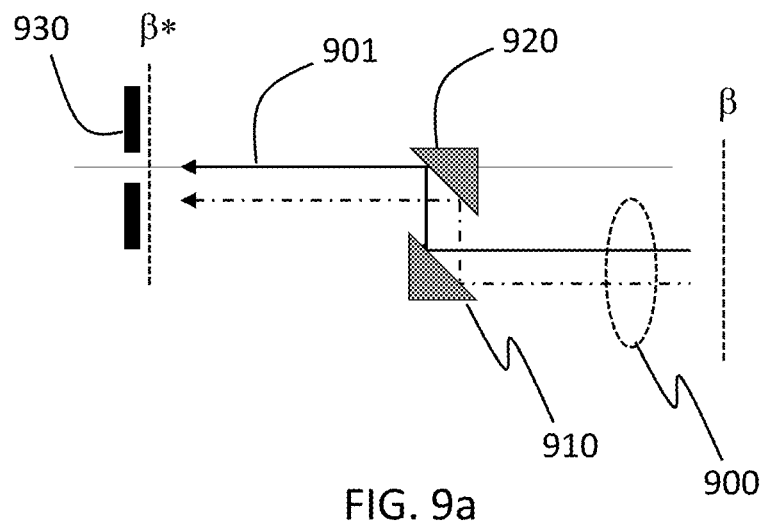
FIG. 9a shows an embodiment of multi-mirror scanning optics that can be used to change the range of angles that are angle-resolved by the slit in FIG. 8 or by an image-conduit in FIG. 11 and FIG. 12.
Figure 9B:
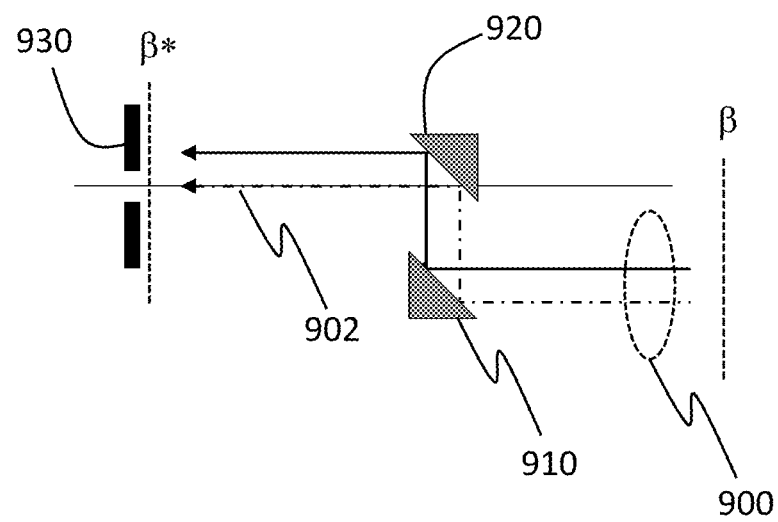
FIG. 9b shows an embodiment of multi-mirror scanning optics that can be used to change the range of angles that are angle-resolved by the slit in FIG. 8 or by an image-conduit in FIG. 11 and FIG. 12.
Figure 11:
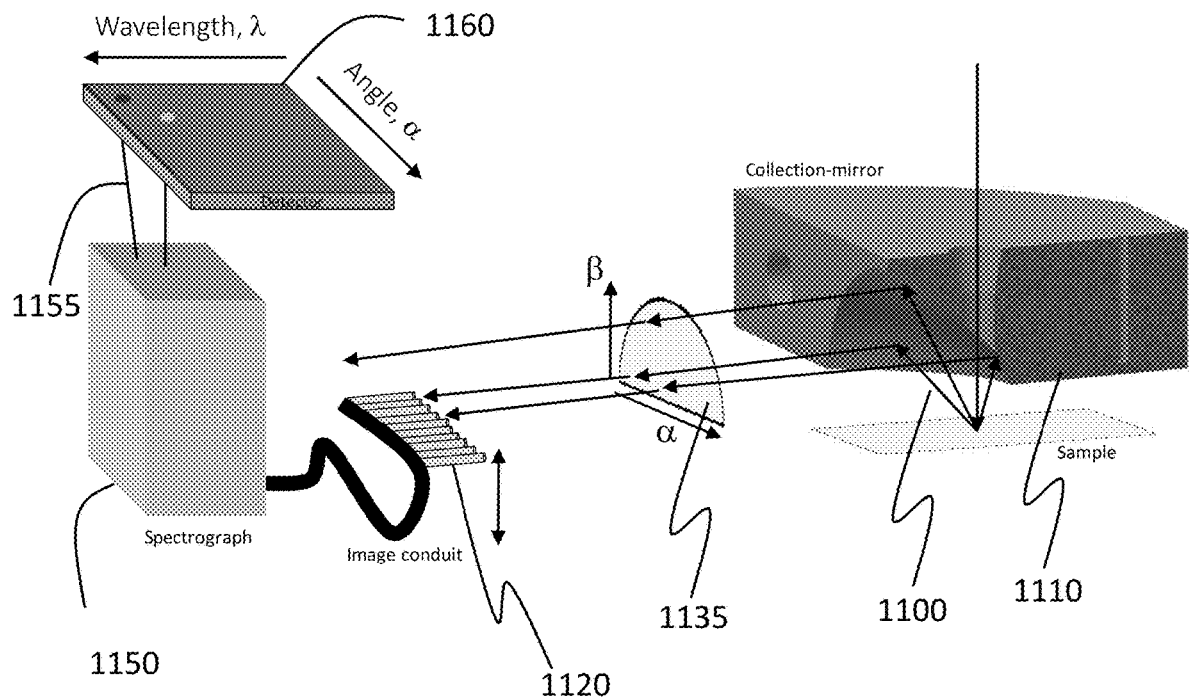
FIG. 11 is an isometric drawing showing the emission of CL reflecting off a collection-mirror, then angle-resolved by a movable image-conduit before passing through a spectrograph that disperses the angle-resolved light into a wavelength-angle image and onto a 2D imaging detector.
Figure 12:
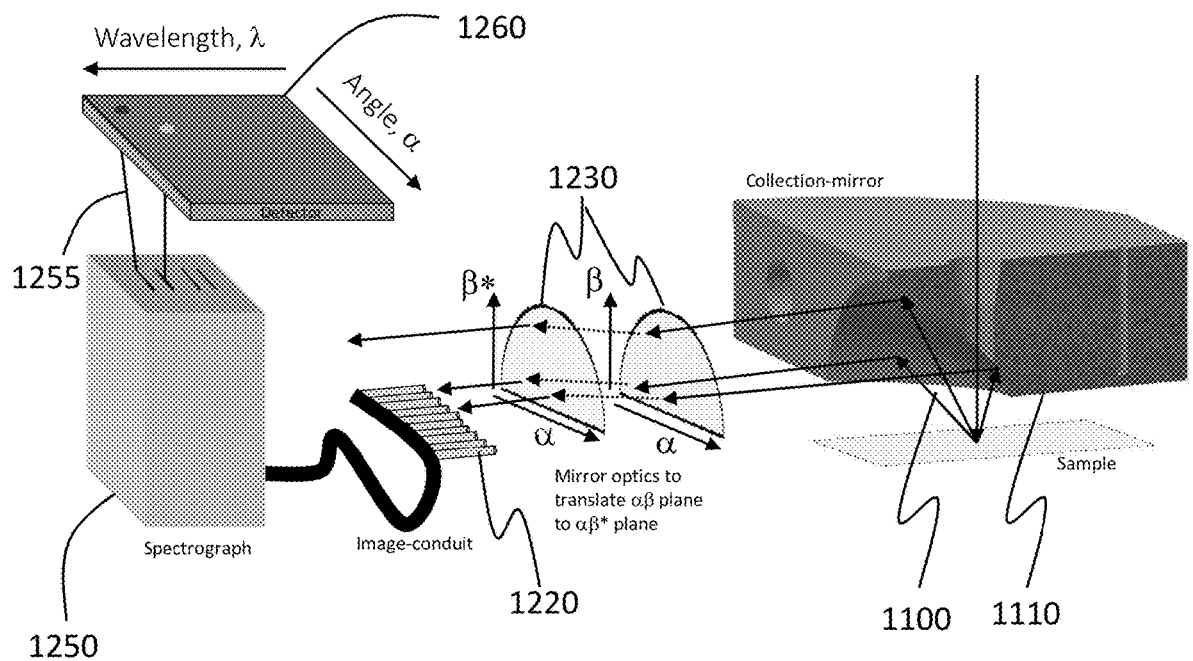
FIG. 12 is an isometric drawing showing the emission of CL reflecting off a collection-mirror, translated by mirror-scanning optics and angle-resolved by a fixed-position image-conduit before passing through a spectrograph that disperses the angle-resolved light into a wavelength-angle image and onto a 2D imaging detector.

FIGS. 9a and 9b show an embodiment of an aspect of the invention, which is a mirror translation apparatus for scanning that can be used to change the range of angles that are angle-resolved by a slit as shown for example in FIG. 8 or by an image-conduit as shown for example in FIG. 11 and FIG. 12. A light pattern 900 incident on the lower fold-mirror 910 in FIG. 9a is reflected to the upper fold-mirror 920 so that light ray 901 passes through the slit 930. Translation of either of the mirrors 910, 920, as shown in FIG. 9b will produce an essentially aberration-free translation of the light pattern such that a different range of light rays, e.g., light ray 902, now passes through the slit 930.

Figure 10A:
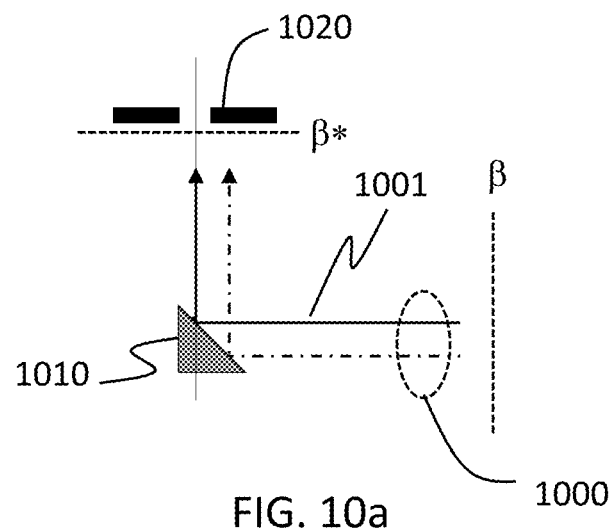
FIG. 10a shows an embodiment of single-mirror scanning optics that can change the range of angles that are angle-resolved by the slit in FIG. 8 or by an image-conduit in FIG. 11 and FIG. 12.
Figure 10B:
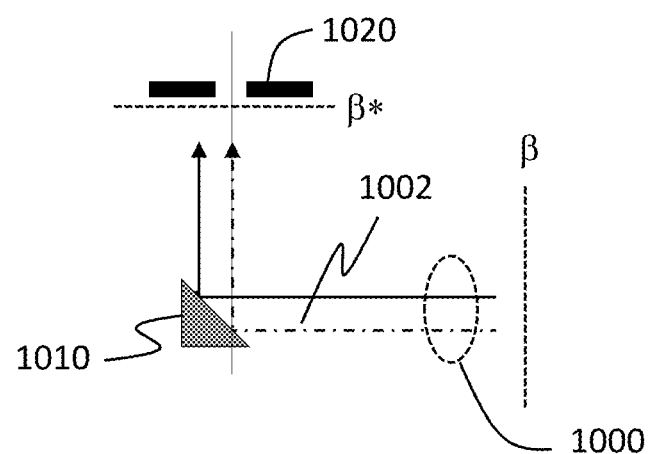
FIG. 10b shows an embodiment of single-mirror scanning optics that can change the range of angles that are angle-resolved by the slit in FIG. 8 or by an image-conduit in FIG. 11 and FIG. 12.

FIGS. 10a and 10b show an embodiment of an aspect of the invention, which is a mirror translation apparatus for scanning that can be used to change the range of angles that are angle-resolved by the slit in FIG. 8 or by an image-conduit in FIG. 12. A light pattern 1000 incident on a single fold-mirror 1010 in FIG. 10a is reflected so that light ray 1001 passes through the slit 1020. Translation of this mirror 1010, as shown in FIG. 10b will produce an essentially aberration-free translation of the light pattern 1000 such that a different range of light rays, e.g., light ray 1002, now passes through the slit 1020. The use of a single fold mirror 1010, instead of multiple mirrors as shown in FIGS. 9 and 9b, has an important advantage of reducing the number of reflections, which maximizes the fraction of photons transmitted through the system. The use of mirrors for translation, instead of the lens translation system depicted in FIG. 7, has important advantages of not introducing chromatic aberrations from the lenses, as well as not introducing off-axis aberrations from the translation process.

FIG. 11 is an isometric drawing of an embodiment of an aspect of the invention showing the emission of CL 1100 reflecting off a collection-mirror 1110, producing light-pattern 1135, then angle-resolved by an image-conduit 1120 before passing through a spectrograph 1150 that disperses the angle resolved light into a wavelength-angle image 1155 and onto a 2D imaging detector 1160. The image-conduit 1120 may be a fiber-optic image-preserving type that approximately transmits the image incident on a first face of the conduit to a second face of the conduit. Translation of the image-conduit 1120 will produce an essentially aberration-free translation of the light-intensity that is then coupled into an optical spectrograph 1150 that disperses the light intensity I as a function of wavelength λ versus angle and then recorded on a 2D detector 1160. FIG. 11 shows translation of the conduit in the β direction, which is optimum for reducing the time to scan to obtain the WRARCL pattern I(α,β,λ), but translation of the conduit 1120 can also be in the α direction. The use of an image conduit can reduce system complexity, but it has disadvantages with respect to free-space-coupling, as shown in FIG. 8, such as signal losses into and in the conduit and potentially loss of resolution in the conduit. In exemplary embodiments, an image conduit is fabricated from optical fibers arranged to substantially transmit the spatial distribution of light incident on the image conduit input surface to an image conduit exit surface where the light emerges. Image conduits where the fibers are fused together are frequently referred to as fiber-optic face plates.

FIG. 12 shows an embodiment of an aspect of the invention wherein a fixed image conduit 1220 is combined with a mirror translation apparatus 1230, an example of which is shown in FIGS. 9a/9b and FIGS. 10a/10b, to translate the light intensity over the image conduit 1220 for the purpose of obtaining the WRARCL pattern I(α,β,λ).

Figure 13:
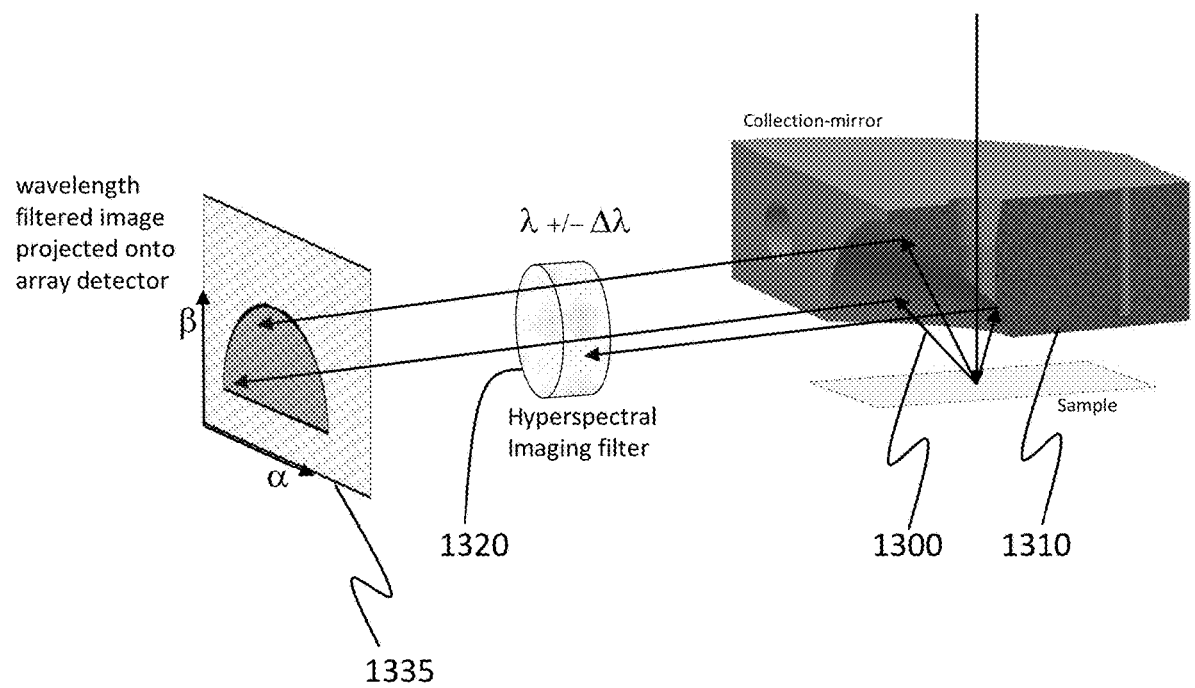
FIG. 13 is an isometric drawing showing the emission of CL reflecting off a collection-mirror, then wavelength-filtered by a hyperspectral imaging filter before passing through a plane αβ and onto an imaging detector.

FIG. 13 is an isometric drawing showing an embodiment of an aspect of the invention, which is the emission of CL 1300 reflecting off a collection-mirror 1310, then wavelength-filtered by a hyperspectral imaging filter 1320 before passing through a plane αβ 1335 and onto an imaging detector (not shown). The WRARCL pattern I(α,β,λ) is obtained by scanning the bandpass wavelength λ+/−Δλ of the hyperspectral imaging filter 1320. The use of a hyperspectral imaging filter significantly reduces system complexity with respect to devices such as that shown in FIGS. 7, 8, 11 and 12. Current hyperspectral imaging filter technologies have significant performance disadvantages with respect to the embodiments depicted in FIG. 7, FIG. 8, FIG. 11, and FIG. 12, such as inferior spectral resolution and inferior spatial resolution. However, it is anticipated that improvements to hyperspectral imaging filter technology will make this embodiment practical for some applications.

Although the invention has been described in detail above, it is expressly understood that it will be apparent to persons skilled in the relevant art that the invention may be modified without departing from the spirit of the invention. Various changes of form, design, or arrangement may be made to the invention without departing from the spirit and scope of the invention. Therefore, the above-mentioned description is to be considered exemplary, rather than limiting, and the true scope of the invention is that defined in the following claims.

No element, act, or instruction used in the description of the present application should be construed as critical or essential to the invention unless explicitly described as such. Also, as used herein, the article "a" is intended to include one or more items. Further, the phrase "based on" is intended to mean "based, at least in part, on" unless explicitly stated otherwise.

What is claimed is:

1. An apparatus for collection and analysis of wavelength-resolved and angle-resolved cathodoluminescence light (CL) comprising:
    a spectrograph;
    a collection-mirror arranged such that CL light collected by said collection-mirror forms a two-dimensional light-pattern representing light intensity as a function of angles of emission of the CL light;
    where said collection-mirror has a symmetric axis and an asymmetric axis; and
    a slit onto which said two-dimensional light pattern is projected, said slit being arranged to permit only a narrow range of said two-dimensional light pattern to be coupled into said spectrograph;
    where said slit is oriented to pass light along said asymmetric axis; and
    wherein said light-pattern is scanned over said slit along said symmetric axis to collect a wavelength-resolved and angle-resolved CL light dataset.

2. The apparatus of claim 1, further comprising a translating fold-mirror arranged to scan said two-dimensional light pattern over said slit.

3. A method for collection and analysis of wavelength-resolved and angle-resolved cathodoluminescence light (CL) from a specimen comprising:
    exposing the specimen to a high energy charged particle beam to produce CL light from the specimen;
    collecting said CL light with a collection-mirror to form a two-dimensional light-pattern representing light intensity as a function of angles of emission of the CL light, said collection-mirror having a symmetric axis and an asymmetric axis;

projecting said two-dimensional light pattern is onto a slit, said slit being arranged to permit only a narrow range of said two-dimensional light pattern to be coupled into a spectrograph, wherein said slit is oriented to pass light along said asymmetric axis; and scanning said light pattern over said slit along said symmetric axis to collect a wavelength-resolved and angle-resolved CL light dataset.

4. The method of claim 3, wherein said scanning of said light pattern is performed by translating a fold mirror.

5. A system for collection and analysis of wavelength-resolved and angle-resolved cathodoluminescence light (CL) from a specimen comprising:

a high energy charged particle source arranged to expose the specimen to a high energy charged particle beam to produce CL light from said specimen;

a spectrograph;

a collection-mirror arranged such that CL light collected by said collection-mirror forms a two-dimensional light-pattern representing light intensity as a function of angles of emission of the CL light;

where said collection-mirror has a symmetric axis and an asymmetric axis; and a slit onto which said two-dimensional light pattern is projected, said slit being arranged to permit only a narrow range of said two-dimensional light pattern to be coupled into said spectrograph;

where said slit is oriented to pass light along said asymmetric axis; and wherein said light-pattern is scanned over said slit along said symmetric axis to collect a wavelength-resolved and angle-resolved CL light dataset.

6. The system of claim 5, further comprising a translating fold-mirror arranged to scan said two-dimensional light pattern over said slit.

* * * * *